(12) United States Patent
Okamoto

(10) Patent No.: US 8,336,202 B2
(45) Date of Patent: Dec. 25, 2012

(54) METHOD OF MANUFACTURING A WIRING BOARD

(75) Inventor: Kenji Okamoto, Tokyo (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 557 days.

(21) Appl. No.: 12/585,913

(22) Filed: Sep. 29, 2009

(65) Prior Publication Data

US 2010/0041228 A1 Feb. 18, 2010

Related U.S. Application Data

(62) Division of application No. 11/358,143, filed on Feb. 22, 2006, now Pat. No. 7,626,124.

(30) Foreign Application Priority Data

May 13, 2005 (JP) .................................. 2005-140498

(51) Int. Cl.
*H05K 3/02* (2006.01)
*H05K 3/10* (2006.01)

(52) U.S. Cl. ........... 29/846; 29/832; 174/260; 427/96.1; 427/455

(58) Field of Classification Search .................. 29/592.1, 29/830, 832, 846; 174/260; 361/704, 717; 427/96.1, 191, 455
See application file for complete search history.

(56) References Cited

U.S. PATENT DOCUMENTS

| | | | |
|---|---|---|---|
| 4,811,166 A * | 3/1989 | Alvarez et al. | 361/717 |
| 6,627,814 B1 * | 9/2003 | Stark | 29/592.1 |
| 7,476,422 B2 * | 1/2009 | Elmoursi et al. | 427/455 |

FOREIGN PATENT DOCUMENTS

| | | | |
|---|---|---|---|
| JP | S63-51690 | | 3/1988 |
| JP | H01-25554 | | 1/1989 |
| JP | H07-78901 | | 3/1995 |
| JP | 2002-012653 | * | 1/2002 |
| JP | 2002-076549 | * | 3/2002 |
| JP | 2002-114836 | * | 4/2002 |
| JP | 2002-203942 | | 7/2002 |

\* cited by examiner

*Primary Examiner* — Donghai D. Nguyen
(74) *Attorney, Agent, or Firm* — Manabu Kanesaka

(57) ABSTRACT

In a method of manufacturing a wiring board, a basic circuit pattern is formed on an insulating plate, and a metal layer is formed on the basic circuit pattern by cold spraying to thereby form a built-up circuit pattern on the basic circuit pattern.

9 Claims, 2 Drawing Sheets

Cold Spray

METHOD OF MANUFACTURING A WIRING BOARD

CROSS REFERENCE TO RELATED APPLICATION

This is a divisional application of patent application Ser. No. 11/358,143 filed on Feb. 22, 2006, now U.S Pat. No. 7,626,124.

BACKGROUND OF THE INVENTION AND RELATED ART STATEMENT

The present invention relates to a method of manufacturing a wiring board. In particular, the invention relates to a method of manufacturing a wiring board of excellent heat dissipating properties which is capable of being applied to power source equipment for industrial use.

Semiconductor modules employed in power source devices are applied over a wide range, from domestic equipment such as domestic air-conditioners or refrigerators, to industrial equipment such as inverters or servo controllers. In particular, a metal base wiring board or ceramic wiring board, which has excellent heat dissipating properties, is employed in for example IGBT (Insulated Gate Bipolar Transistor) modules incorporating power semiconductors, on account of the large amount of heat which these generate.

FIG. 3 is a view showing the cross-sectional construction of a conventional metal base wiring board.

A metal base wiring board has a three-layer structure comprising base metal 101, an insulating layer 102 formed on top of this base metal 101, and a circuit pattern 103 formed on top of this insulating layer 102. For the base metal 101, metal of excellent heat dissipating properties such as aluminum sheet or copper sheet, is employed. The insulating layer 102 comprises for example epoxy resin containing an inorganic filler such as $SiO_2$, $Al_2O_3$ or AlN.

For the circuit pattern 103, usually, copper foil is employed, but sometimes aluminum foil is employed. As the copper foil, usually copper foil of thickness about 35 µm to 140 µm is employed. This copper foil is processed to form a prescribed circuit pattern using wet etching. In the case of a power semiconductor whose current capacity is small at about 10A and that generates little heat, the power semiconductor can be directly mounted by soldering to this circuit pattern 103. In the case of a power semiconductor of large current capacity, the thickness of the copper foil is increased to about 140 µm, in order to reduce the thermal resistance by spreading the heat out over this circuit pattern 103. If 140 µm is insufficient, even thicker copper foil such as for example copper foil of thickness 200 µm or 250 µm may be employed. Furthermore, if the thickness of the circuit pattern 103 is more than 1 mm, for example if a thickness of 3 to 4 mm is employed, a heat spreading effect is exhibited, allowing the heat generated in the power semiconductor to spread in the transverse direction and thereby greatly reducing the thermal resistance.

The insulating layer 102 that is used in a metal base wiring board needs to have excellent insulation reliability and heat dissipating properties. Furthermore, the insulating layer 102 needs to have excellent stress moderating properties, resistance to humidity and heat withstanding ability and the like; resin compositions which are suitable in this respect are known (see for example Laid-open Japanese Patent Publication No. 2002-12653, Laid-open Japanese Patent Publication No. 2002-76549 or Laid-open Japanese Patent Publication No. 2002-114836). In this way, a metal base wiring board is employed as a wiring board on which are mounted components that generate a lot of heat, such as power semiconductors, by bonding of the circuit pattern 103 with base metal 101 with interposition of an insulating layer 102 of excellent heat dissipating properties.

However, in the case of epoxy resin containing inorganic filler such as $SiO_2$, $Al_2O_3$ or AlN, there are limits to the filler content, so the thermal conduction coefficient of such material is currently about 7 to 10 W/m·K. There are therefore also limits to the current capacity of the power semiconductor modules in which these can be employed; currently they can only be employed in modules up to about the 50A class.

Accordingly, in the case of power semiconductor modules of larger capacity exceeding 50A, ceramics wiring boards are employed, which have higher thermal conductivity of the insulating layer, rather than metal base wiring boards.

FIGS. 4a and 4b show the cross-sectional structure of a conventional ceramics wiring board, with FIG. 4a showing a ceramics wiring board and FIG. 4b showing a ceramics wiring board with base metal bonded thereto.

The ceramics wiring board is constructed by attaching a circuit pattern 103 onto both sides of a ceramics insulating plate 104. The ceramics insulating plate 104 is manufactured by kneading raw-material powder with a binder to produce an insulating plate in the form of a sheet, called a "green sheet," and firing this at high temperature. After this, the wiring board is produced by bonding copper foil or aluminum foil for the circuit pattern 103 thereto at high temperature. Furthermore, this ceramics wiring board is usually bonded by means of a solder layer 105 to base metal 101 consisting of copper sheet of thickness about 2 to 3 mm.

For example $Al_2O_3$, AlN or $Si_3N_4$ are employed as the raw material for the ceramics insulating plate 104. The thermal conductivity of this ceramics insulating plate 104 is about 20 W/m·K in the case where the raw material is $Al_2O_3$, is about 60 to 180 W/m·K in the case where the raw material is AlN, and is about 80 W/m·K in the case where the raw material is $Si_3N_4$; i.e., its thermal conductivity is one to two orders of magnitude higher than in the case where inorganic filler is blended with epoxy resin.

However, in the case of metal base wiring boards, the thermal resistance is reduced, so, if thick copper foil is employed, the time required for the etching processing for processing the circuit pattern layer is increased in proportion to the thickness; processing costs are thereby greatly increased, giving rise to the problem that overall costs are greatly increased. Furthermore, if the thickness of the circuit pattern layer reaches 3 to 4 mm, a long time is required for melting of the copper and, in addition, etching of the edges of the circuit pattern layer cannot be achieved with high precision, so the etching process itself becomes impracticable.

A further problem was that, in the case of a ceramics wiring board, many steps were necessary, involving first manufacturing a ceramics insulating board, bonding this with a circuit pattern, etching processing, and bonding the ceramics wiring board manufactured in this way with the base metal by soldering, thus increasing the price and making it difficult to achieve price reduction. Furthermore, in the case of a ceramics wiring board, it is not possible to make the copper foil for the circuit pattern very thick. Although thick copper foil or copper sheet may be attached in order to increase the heat spreading effect, the copper sheet must be bonded with the ceramics insulating sheet at high temperature of about 1000° C. or more. If these two thicknesses are not made the same, warping is produced by the bimetal effect on cooling, due to the difference in thermal expansion coefficients. Also, as described above, if the copper foil or copper sheet is made thick, the cost of the etching process is greatly increased, so, currently, in fact, no ceramics wiring boards are employed having a circuit pattern thickness of not more than about 0.6 mm.

An object of the present invention is to provide a method of manufacturing a wiring board of low cost and excellent heat dissipating performance, which can be manufactured with few steps.

Further objects and advantages of the invention will be apparent from the following description of the invention and the associated drawings.

SUMMARY OF THE INVENTION

According to the present invention, in order to solve the above problems, a method of manufacturing a wiring board is such that a circuit pattern is formed by attaching metal foil onto an insulating sheet and processing this metal foil features the provision of a built-up circuit pattern on top of the circuit pattern, this built-up circuit pattern being formed by increasing the thickness by lamination of metal material on top of the circuit pattern by the cold spray process.

With such a wiring board, a built-up metal pattern of even greater thickness is formed on top of the circuit pattern of the metal foil. In this way, when a power semiconductor is mounted on this thick built-up circuit pattern, the heat that is generated by losses therein is diffused by the thick built-up pattern, so the thermal resistance can be reduced, making it possible to construct a wiring board of excellent heat dissipation with little thermal resistance.

Also, according to the present invention, a wiring board comprising a built-up circuit pattern is a metal base wiring board in which an insulating sheet is made of resin filled with an inorganic filler bonded to a metal sheet.

Furthermore, according to the present invention, the wiring board comprising a built-up circuit pattern is a ceramics wiring board in which the insulating sheet is made of ceramics insulating sheet with metal foil attached on both sides thereof and the raw material of the ceramics insulating sheet is one selected from $Al_2O_3$, AlN, and $Si_3N_4$.

Since in the wiring board according to the present invention the circuit pattern of the foil can be formed at least partially thicker, when a power semiconductor is mounted on this thick circuit pattern, the heat that is generated by losses therein can be diffused by the thick circuit pattern, so thermal resistance can be reduced, offering the advantage that manufacture of a wiring board of excellent heat dissipation and much less thermal resistance than a conventional metal base wiring board or ceramics wiring board can be performed easily and at low cost.

BRIEF DESCRIPTION OF THE DRAWINGS

FIGS. 1a-1d show the process of manufacturing a wiring board according to the present invention and the condition of a completed power semiconductor module, wherein FIG. 1a shows a metal base wiring board, FIG. 1b shows the step of forming a built-up circuit pattern using a cold spray process, FIG. 1c shows a condition in which a built-up circuit pattern has been formed, and FIG. 1d shows a power semiconductor module in which a power semiconductor is mounted on a built-up circuit pattern;

FIGS. 4a and 4b show a cross-sectional structure of a conventional ceramics wiring board, wherein FIG. 4a shows a ceramics wiring board, and FIG. 4b shows a ceramics wiring board in which a base metal is bonded thereto.

DETAILED DESCRIPTION OF THE PREFERRED EMBODIMENTS

Hereinbelow, an embodiment of the present invention is described in detail with reference to the drawings in which the invention is applied to an example wherein a metal foil is attached to an insulating layer and a metal base printed wiring board is formed with a prescribed circuit pattern by processing this metal foil.

Figure 1A:
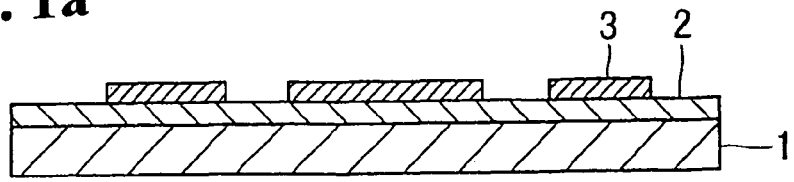
Figure 1B:
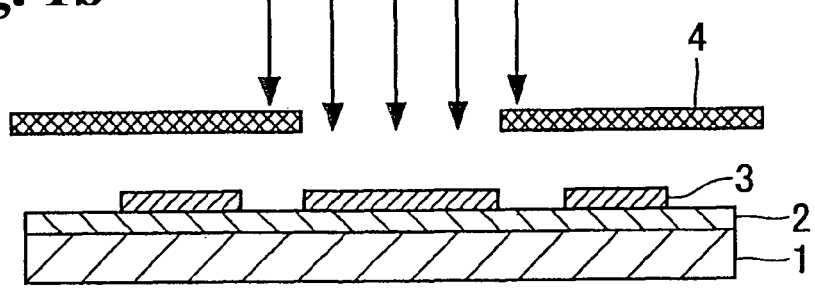
Figure 1C:
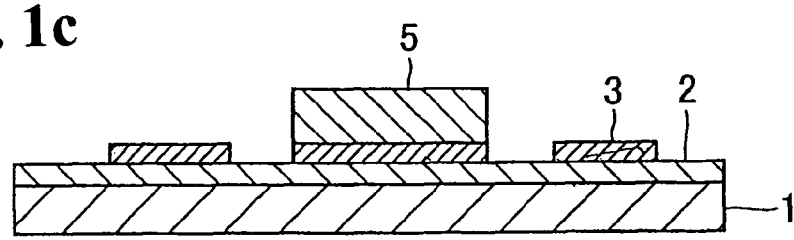
Figure 1D:
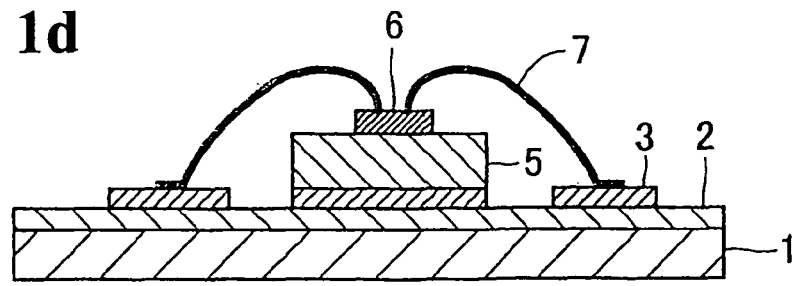

FIGS. 1a-1d show the process of manufacturing a wiring board according to the present invention and the condition of a completed power semiconductor module, wherein FIG. 1a shows a metal base wiring board, FIG. 1b shows the step of forming a built-up circuit pattern using a cold spray process, FIG. 1c shows a condition in which a built-up circuit pattern has been formed, and FIG. 1d shows a power semiconductor module in which a power semiconductor is mounted on a built-up circuit pattern.

As shown in FIG. 1a, a metal base wiring board is of a three-layer construction constituted by providing an insulating layer 2 containing inorganic filler on base metal 1, and attaching a circuit pattern 3 on top of this.

As the circuit pattern 3, usually copper foil is employed. Aluminum foil could be employed for this circuit pattern 3 instead of copper foil. The copper foil that is attached to the insulating layer 2 is processed to the prescribed pattern by wet etching to produce the circuit pattern 3. As the copper foil, a standard product having a thickness of about 35 µm to 140 µm may normally be employed. Also, although the pattern thickness of the circuit pattern 3 is determined by the current capacity of the circuit, taking into consideration the costs of etching processing, the thickness of the copper foil should preferably be made as thin as possible.

The metal base wiring board formed as described above is the same as the conventional metal base wiring board, but, in the case of a wiring board according to the present invention, the thickness is increased locally, exclusively in a region of the circuit pattern 3 where heat dissipation is desired to be improved. Specifically, as shown in FIG. 1b, a mask 4 that is formed with a hole in the shape corresponding to the region where the thickness is desired to be increased is arranged on the circuit pattern 3 and metal powder is sprayed thereon from above at normal temperature and ultrasonic speed by the cold spray process, thereby laminating a layer of metal powder onto the circuit pattern 3. In this way, a built-up circuit pattern 5 as shown in FIG. 1c is formed.

A description will now be given regarding the cold spray process. The cold spray process is considered to be a type of spray coating technique. Gas at a temperature lower than the melting point or softening temperature of the spray coating material is used to produce a gas current of ultrasonic speed; particles of spray coating material are accelerated by being injected into this current and a coating is formed by blasting the substrate with these particles still in the solid state. A characteristic feature of the cold spray process is that the temperature of the working gas that is used to heat/accelerate the spray coating material particles is much lower than in the case of, for example, the conventional plasma spray coating method, flame spray coating method or high-speed flame spray coating method. For plasma spray coating and the like processes, a high working gas temperature of 2000 to 8000° C. is necessary, but, in the case of cold spray, a working gas of ordinary temperature to about 600° C. may be employed. Although the spray coating material particles are made to collide with the substrate at high speed while still in the solid state without being heated to any great extent, when a critical speed is reached, plastic deformation of the substrate and the spray coating material particles takes place due to the energy of impact, resulting in the formation of a coating. As a result, in contrast to other spray coating methods, oxidation or thermal denaturing of the spray coating material due to heat can be minimized.

In the cold spray device, high-pressure gas supplied from a gas source such as a cylinder is branched to a powder supply device and a gas heater. Of this high-pressure gas, the working gas constituting the main flow is raised in temperature by flowing through a gas pipe of coil shape that is directly or indirectly heated by, for example, an electric furnace, before being supplied to the spray coating gun where. it is accelerated and sprayed by means of an ultrasonic speed nozzle.

Meanwhile, part of the working gas is branched to the powder supply device, where it acts as a carrier gas and is caused to flow into the rear of the spray coating gun together with the spray coating powder. In some cases, heating of the working gas need not be performed, but such heating is advantageous in that heating makes it possible to use higher particle speeds and in order to facilitate generation of plastic deformation of the particles. Air, helium, or nitrogen may be employed as the gas.

As the spray coating material that is sprayed onto the circuit pattern 3, metal material of particle size 1 to 50 μm may be employed. As this particle material, for example copper, aluminum, iron, titanium, molybdenum, or nickel may be employed. For the wiring board, usually, copper or aluminum is employed. These spray coating material particles are deposited by being blasted-onto the circuit pattern 3 through the mask 4 separated by a distance of 10 to 50 mm, with a speed of 500 to 900 m/s: a built-up circuit pattern 5 is thereby formed on the circuit pattern 3 as shown in FIG. 1*c*. Blasting with spray coating material particles is performed for a prescribed time in order to obtain the necessary film thickness of the built-up circuit pattern 5. The thickness of the built-up circuit pattern 5 is set taking into account the loss generated by the power semiconductor. Although this depends on the amount of loss generated, the thickness of an effective built-up circuit pattern 5 is about 0.5 mm to 5 mm.

A metal base wiring board of a three-layer structure wherein a built-up circuit pattern 5 is directly bonded with the copper foil is manufactured by the manufacturing steps described above. After this, a power semiconductor 6 is mounted on the built-up circuit pattern 5 that has been deposited by cold spraying. The power semiconductor 6 is usually bonded to the built-up circuit pattern 5 by means of SnPb-based solder or SnAgCu-based solder.

Finally, the necessary wiring up of the power semiconductor 6 is performed using wire 7 in order to achieve connection with the external circuit, to manufacture a power semiconductor module as shown in FIG. 1*d*. In the case of a semiconductor element of large current capacity such as the power semiconductor 6, aluminum wire is normally used for the wire 7.

It should be -noted that, although the built-up circuit pattern 5 built up by cold spraying was formed exclusively in the portion of the circuit pattern 3 where the power semiconductor 6 in respect of which heat dissipation was required was mounted, this built-up circuit pattern could be formed over the entire circuit pattern 3.

Also, whether copper material or other metal material deposited by cold spraying is employed, the thermal conductivity that is possessed by the material itself can be obtained.

Figure 4A:
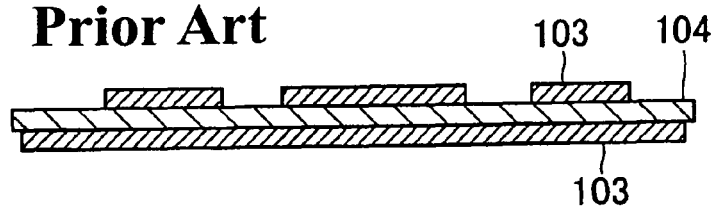
Figure 4A:
Figure 4B:
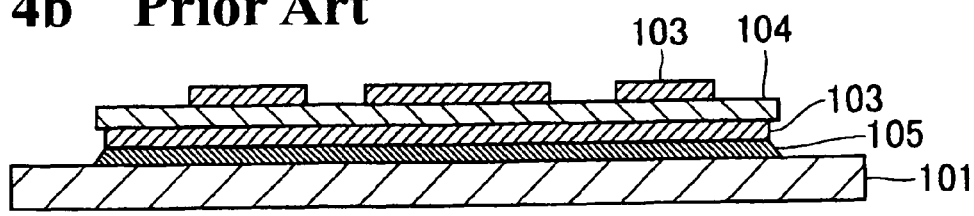

In addition, in this case, as an embodiment of a wiring board, the case of a metal base wiring board was described, but, even in the case of a ceramic wiring board as shown in FIG. 4, a built-up circuit pattern could be formed by the same method of manufacture on the circuit pattern 103 on the side where the power semiconductor is mounted.

Next, optimization of the thickness of the built-up circuit pattern 5 deposited on the circuit pattern 3 by cold spraying will be described.

Figure 2:
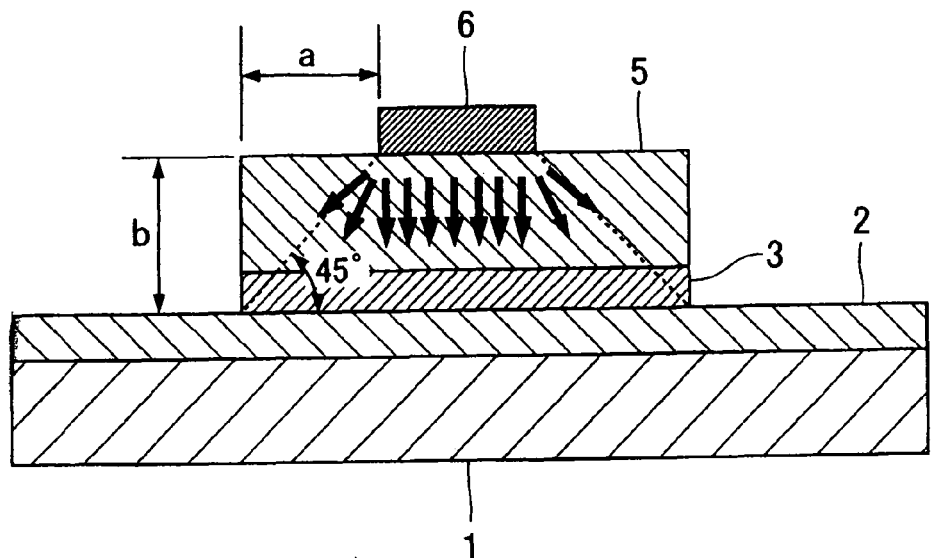
FIG. 2 is a diagram regarding a thickness of a built-up circuit pattern.
Figure 3:
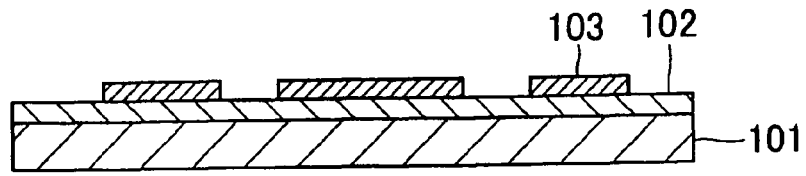
FIG. 3 is a view showing a cross-sectional structure of a conventional metal base wiring substrate.

FIG. 2 is a diagram regarding the thickness of the built-up circuit pattern.

The heat current that is generated from the power semiconductor 6 has the property of normally diffusing and spreading out at an angle of inclination of 45 degrees. If therefore the distance a from the chip edge of the power semiconductor 6 to the edge of the built-up circuit pattern 5 is equal to the thickness b of the sum of the circuit pattern 3 and built-up circuit pattern 5, the heat spreading effect is manifested to a maximum, making it possible to greatly reduce the thermal resistance. There is therefore no need for useless increase in the width of the circuit pattern 3 and built-up circuit pattern 5 with respect to the size of the power semiconductor 6 and there is no need for useless increase in the thickness of the built-up circuit pattern 5.

While, from the relationship of the width and thickness of the built-up circuit pattern 5 described above, the optimum ratio of the distance a from the edge of the mounted power semiconductor 6 to the edge of the built-up circuit pattern 5 and the thickness b of the sum of the circuit pattern 3 and built-up circuit pattern 5 is 1, a substantially satisfactory thermal diffusion effect can be obtained so long as this ratio is in the range of 0.8 to 1.2. If this ratio is less than 0.8, in some cases, sufficient thermal diffusion may not be obtained and if this ratio exceeds 1.2 the effect is saturated.

In the embodiment described above, a detailed description was given of the case where the invention was applied to a printed wiring board formed with a prescribed circuit pattern by attaching metal foil such as copper onto an insulating layer or ceramics insulating plate and processing this metal foil, but the present invention could also be applied to thickness adjustment of a lead frame circuit pattern.

The disclosure of Japanese Patent Application No. 2005-140498 filed on May 13, 2005, is incorporated herein.

While the invention has been explained with reference to the specific embodiments of the invention, the explanation is illustrative, and the invention is limited only by the appended claims.

What is claimed is:

1. A method of manufacturing a wiring board comprising:
    forming a basic circuit pattern on an insulating plate,
    forming a metal layer on the basic circuit pattern by cold spraying metallic particle onto the basic circuit pattern to form a built-up circuit pattern on the basic circuit pattern, said built-up circuit pattern being directly deposited on the basic circuit pattern to have a predetermined shape without further processing and being thicker than the basic circuit pattern, and
    mounting a heat-generating semiconductor component on the built-up circuit pattern,
    wherein the built-up circuit pattern is provided at least on the basic circuit pattern in a region where the semiconductor component is mounted, and the built-up circuit pattern and the basic circuit pattern have a total thickness equal to a distance from an edge of the mounted semiconductor component to an edge of the built-up circuit pattern.

2. The method of manufacturing the wiring board according to claim 1, wherein the insulating plate is a metal base wiring board comprising a metal plate, and an inorganic filler-containing resin bonded to the metal plate.

3. The method of manufacturing the wiring board according to claim 1, wherein the insulating plate is a ceramic wiring board comprising a ceramic insulating plate with metal foil on two sides thereof, and the ceramic insulating plate consists of one material selected from the group consisting of $Al_2O_3$, AlN, and $Si_3N_4$.

4. The method of manufacturing the wiring board according to claim 1, wherein the metal material is one selected from the group consisting of copper, aluminum, iron, titanium, molybdenum, and nickel.

5. The method of manufacturing the wiring board according to claim 1, wherein said metal layer directly formed on the basic circuit pattern is only partly disposed on the basic circuit pattern without forming an entire surface of the basic circuit pattern.

6. The method of manufacturing the wiring board according to claim 1, wherein a metal foil of the basic circuit pattern has a thickness selected to facilitate etching thereof during fabrication there.

7. A method of manufacturing a wiring board, comprising:
forming a basic circuit pattern on an insulating plate,
forming a metal layer on the basic circuit pattern by cold spraying metallic particle onto the basic circuit pattern to form a built-up circuit pattern on the basic circuit pattern, said built-up circuit pattern being directly deposited on the basic circuit pattern to have a predetermined shape without further processing and being thicker than the basic circuit pattern, and
mounting a heat-generating semiconductor component on the built-up circuit pattern,
wherein the built-up circuit pattern is provided at least on the basic circuit pattern in a region where the semiconductor component is mounted, and
the built-up circuit pattern and the basic circuit pattern have a total thickness having a ratio of the total thickness to a distance from an edge of the mounted semiconductor component to the edge of the built-up circuit pattern in a range of from 0.8 to 1.2.

8. The method of manufacturing the wiring board according to claim 7, wherein the insulating plate is a metal base wiring board comprising a metal plate, and an inorganic filler-containing resin bonded to the metal plate.

9. The method of manufacturing the wiring board according to claim 7, wherein said metal layer directly formed on the basic circuit pattern is disposed on an entire surface of the basic circuit pattern.

* * * * *